United States Patent
Nagase et al.

(10) Patent No.: US 9,620,561 B2
(45) Date of Patent: Apr. 11, 2017

(54) MAGNETORESISTIVE ELEMENT AND MANUFACTURING METHOD THEREOF

(71) Applicants: Toshihiko Nagase, Seoul (KR); Daisuke Watanabe, Seoul (KR); Youngmin Eeh, Seoul (KR); Koji Ueda, Seoul (KR); Kazuya Sawada, Seoul (KR); Makoto Nagamine, Seoul (KR)

(72) Inventors: Toshihiko Nagase, Seoul (KR); Daisuke Watanabe, Seoul (KR); Youngmin Eeh, Seoul (KR); Koji Ueda, Seoul (KR); Kazuya Sawada, Seoul (KR); Makoto Nagamine, Seoul (KR)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 27 days.

(21) Appl. No.: 14/627,552

(22) Filed: Feb. 20, 2015

(65) Prior Publication Data

US 2016/0072046 A1    Mar. 10, 2016

Related U.S. Application Data

(60) Provisional application No. 62/046,841, filed on Sep. 5, 2014.

(51) Int. Cl.
  *H01L 21/00* (2006.01)
  *H01L 29/82* (2006.01)
  *H01L 27/22* (2006.01)
  *H01L 43/08* (2006.01)
  *H01L 21/677* (2006.01)
  *H01L 43/12* (2006.01)

(52) U.S. Cl.
  CPC ...... *H01L 27/222* (2013.01); *H01L 21/67709* (2013.01); *H01L 29/82* (2013.01); *H01L 43/08* (2013.01); *H01L 43/12* (2013.01)

(58) Field of Classification Search
  CPC .............................. H01L 27/222; H01L 29/82
  USPC .................................... 438/59; 257/421–422
  See application file for complete search history.

(56) References Cited

U.S. PATENT DOCUMENTS

| | | | |
|---|---|---|---|
| 6,602,620 B1* | 8/2003 | Kikitsu | G11B 5/7325 428/838 |
| 8,299,552 B2 | 10/2012 | Nagase et al. | |
| 8,363,362 B2* | 1/2013 | Fuke | B82Y 10/00 360/322 |
| 8,604,569 B2* | 12/2013 | Hosotani | B82Y 25/00 257/421 |
| 8,737,122 B2* | 5/2014 | Saida | G11C 11/16 365/148 |
| 8,750,029 B2 | 6/2014 | Kitagawa et al. | |

(Continued)

FOREIGN PATENT DOCUMENTS

JP   2002222517 A   8/2002

Primary Examiner — Calvin Lee
(74) Attorney, Agent, or Firm — Holtz, Holtz & Volek PC

(57) ABSTRACT

According to one embodiment, a magnetoresistive element is disclosed. The magnetoresistive element includes an underlayer containing aluminum (Al), nitrogen (N) and X. The X is an element other than Al and N. A first magnetic layer is provided on the underlayer. A nonmagnetic layer is provided on the first magnetic layer. A second magnetic layer is provided on the nonmagnetic layer.

17 Claims, 5 Drawing Sheets

(56) References Cited

U.S. PATENT DOCUMENTS

| | | |
|---|---|---|
| 9,178,133 B2 * | 11/2015 | Kitagawa ................ H01L 43/10 43/8 |
| 2012/0070695 A1 | 3/2012 | Kitagawa et al. |
| 2012/0088125 A1 | 4/2012 | Nishiyama et al. |
| 2012/0286339 A1 | 11/2012 | Asao |
| 2014/0131824 A1 | 5/2014 | Kitagawa et al. |

* cited by examiner

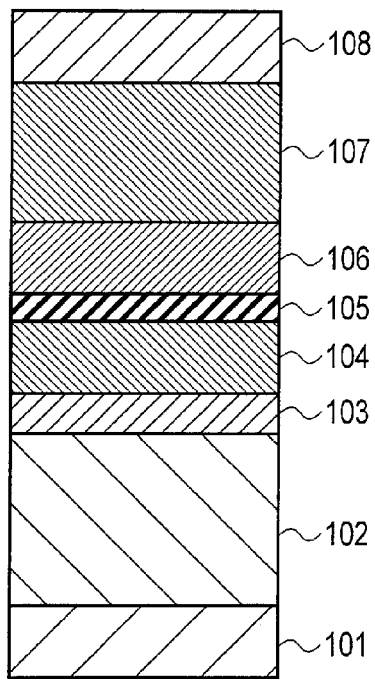
F I G. 1
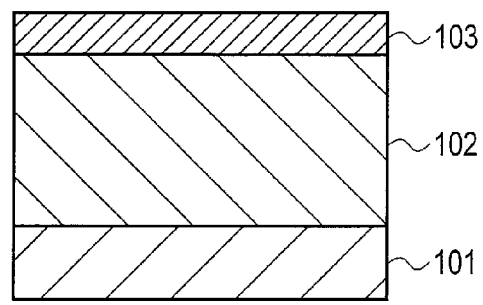
F I G. 2
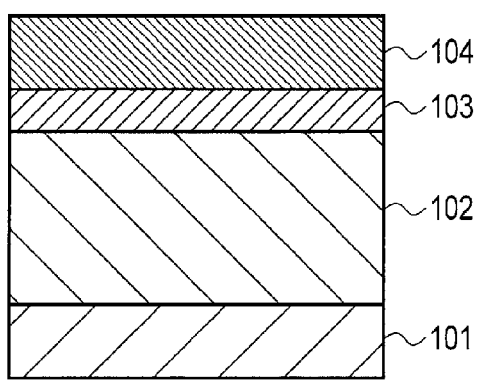
F I G. 3
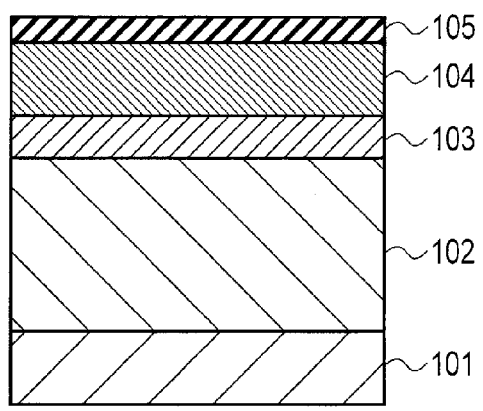
F I G. 4

MAGNETORESISTIVE ELEMENT AND MANUFACTURING METHOD THEREOF

CROSS-REFERENCE TO RELATED APPLICATIONS

This application claims the benefit of U.S. Provisional Application No. 62/046,841, filed Sep. 5, 2014, the entire contents of which are incorporated herein by reference.

FIELD

Embodiments described herein relate generally to a magnetoresistive element and a method of manufacturing the same.

BACKGROUND

In recent years, semiconductor memories utilizing resistance variation elements as storage elements, such as phase-change random access memories (PRAMs) and magnetic random access memories (MRAMs), have received attention and have been developed. The MRAMs are devices in which memory cells are made to store information "1" or "0", using magnetoresistive effects, to thereby perform a memory operation, and are featured in that they have nonvolatility, a high-speed operation, a high integration and a high reliability.

A large number of MRAMs have been reported which use elements exhibiting a tunneling magnetoresistive (TMR) effect which is one of the above magnetoresistive effects. As a magnetoresistive element, a magnetic tunnel junction (MTJ) element is provided which includes a three-layer lamination structure having a storage layer having a variable magnetization direction, an insulating film serving as a tunnel barrier and a reference layer maintaining a predetermined magnetization direction.

A resistance of the MTJ element varies in accordance with the magnetization directions of the storage layer and the reference layer, it takes a low resistance state when the magnetization directions are parallel, and it takes a high resistance state when the magnetization directions are antiparallel; and information is stored by associating the above parallel and antiparallel states with binary information "0" and "1".

Methods of writing information to the MTJ element include a magnetic-field writing method in which only the magnetization direction of the storage layer is reversed by current magnetic field that is generated when current is flowed through a writing line, and a writing (current driven switching) method using a spin angular momentum transfer in which the magnetization direction of the storage layer is reversed by passing a spin polarized current through the MTJ element itself.

In the former method, when the element size is reduced, a coercive force of a magnetic substance constituting the storage layer increases, and the write current tends to be increased, and thus it is hard to achieve both miniaturization of the element and lowering of the current at the same time.

On the other hand, in the latter method, the number of spin polarized electrons to be injected decreases as the volume of a magnetic substance constituting the storage layer decreases, it is expected that both miniaturization of the element and lowering of the current will be easily achieved at the same time.

BRIEF DESCRIPTION OF THE DRAWING

FIG. 1 is a cross-sectional view schematically showing a magnetoresistive element according to a first embodiment;

FIG. 2 is a cross-sectional view for explaining a manufacturing method of the magnetoresistive element according to the first embodiment;

FIG. 3 is a cross-sectional view for explaining the manufacturing method of the magnetoresistive element according to the first embodiment following FIG. 2;

FIG. 4 is a cross-sectional view for explaining the magnetoresistive element according to the first embodiment following FIG. 3;

DETAILED DESCRIPTION

Figure 5:
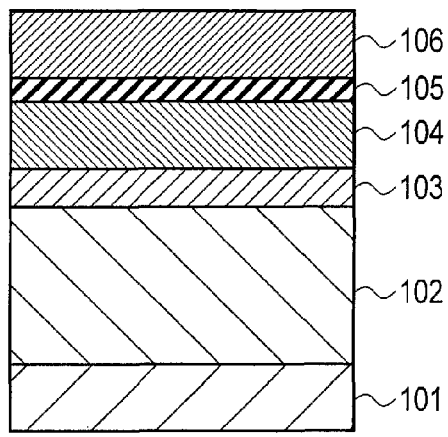
FIG. 5 is a cross-sectional view for explaining the magnetoresistive element according to the first embodiment following FIG. 4.

Embodiments will be described hereinafter with reference to the accompanying drawings. In each of the drawings, portions corresponding to those in a previous drawing or drawings will be denoted by the same reference numerals (including the same reference numerals with different suffixes) as in the previous drawing or drawings, and their detailed explanations will be omitted.

According to an embodiment, a magnetoresistive element is disclosed. The magnetoresistive element includes an underlayer containing X including aluminum (Al) and nitrogen (N). The X is an element other than Al and N. A first magnetic layer is provided on the underlayer. A nonmagnetic layer is provided on the first magnetic layer. A second magnetic layer is provided on the nonmagnetic layer.

According to another embodiment, a method of manufacturing a magnetoresistive element is disclosed. The method includes forming an underlayer containing aluminum (Al), nitrogen (N) and X. The X is an element other than Al and N. The method further includes: forming a first magnetic layer on the underlayer, forming a tunnel barrier layer on the first magnetic layer, and forming a second magnetic layer on the tunnel barrier layer.

First Embodiment

FIG. 1 is a cross-sectional view schematically showing a magnetoresistive element according to a first embodiment. To be more specific, it shows a cross section structure of a current driven switching type of MTJ element.

In the figure, 101 denotes a bottom electrode, the bottom electrode 10 is provided on a silicon substrate (semiconductor substrate) not shown.

On the bottom electrode 101, a buffer layer 102 is provided. A material of the buffer layer 102 contains Hf. The material of the buffer layer 102 is not limited to Hf. That is, Ta, Ti, W, Zr, Hf, Cr or an alloy including at one of the elements can be used as the material of the buffer layer 102.

On the buffer layer 102, an underlayer 103 is provided. The underlayer 103 includes compound of aluminum (Al), nitrogen (N) and titanium (Ti). The underlayer 103 may further include compound of Al and N, or compound of Ti and N, or both these compounds. However, the underlayer 103 does not include a metallic state of Al.

On the underlayer 103, a first magnetic layer 104 is provided used as a recording layer. The first magnetic layer 104 is a magnetic layer whose magnetization direction is variable, and has perpendicular magnetization that is perpendicular or substantially perpendicular to a film surface. Material of the first magnetic layer 104 includes, e.g., CoFeB.

On the first magnetic layer 104, a tunnel barrier layer (nonmagnetic layer) 105 is provided. Material of the tunnel barrier layer 105 includes, e.g., MgO.

On the tunnel barrier layer 105, a second magnetic layer 106 is provided used as a reference layer. The second magnetic layer 106 is a magnetic layer whose magnetization direction is fixed, and has perpendicular magnetization that is perpendicular or substantially perpendicular to the film surface. The second magnetic layer 106 includes a multilayer of, e.g., a Co layer and a Pt layer. It is noted that a structure with the first and second magnetic layers 104 and 106 which are respectively the reference and second magnetic layers may be employed.

On the second magnetic layer 106, a shift canceling layer 107 is provided; and on the shift canceling layer 107, an upper electrode 108 is provided.

The shift canceling layer 107 is a magnetic layer whose magnetization direction is invariable, and has perpendicular magnetization that is perpendicular or substantially perpendicular to the film surface. In addition, the magnetization direction is opposite to the magnetization direction of the second magnetic layer 106. Thereby, the shift canceling layer 107 can cancel a stray field from the second magnetic layer 106 (reference layer) applied to the first magnetic layer 104 (recording layer). In other words, the shift cancelling layer 107 has an effect of adjusting, an offset of switching field for the storage layer due to the strayed magnetic field from the reference layer, to the opposite direction. The shift cancelling layer 107 comprises, for example, a multilayer formed of a stacked structure of a ferromagnetic material such as Ni, Fe, or Co and a nonmagnetic material such as Cu, Pd, or Pt.

The MTJ element of the present embodiment will be further explained along its manufacturing method.

FIGS. 2-6 are cross-sectional views for explaining the manufacturing method of the MTJ element according to the present embodiment.

As shown in FIG. 2, the bottom electrode 101, the buffer layer 102 and the underlayer 103 are formed on the silicon substrate not shown.

The buffer layer 102 has a function of absorbing roughness of a surface of the bottom electrode 101. Furthermore, the buffer layer 102 has a function of controlling a crystalline orientation, a grain size, or the like of the underlayer 103 to be formed on the buffer layer 102. Although the examples of the material of the buffer layer 102 are described above, it is further preferable that Zr or Hf having a hexagonal closed packed (hcp) structure be used as the material of the buffer layer 102 to improve a crystal structure of AlTiN as the underlayer 103. In the present embodiment, the buffer layer 102 contains Hf.

The underlayer 103 has a function of controlling a crystalline orientation or grain size of the first magnetic layer 104 to be formed on the underlayer 103. The underlayer 103 contains compound of Al, Ti and N, but does not contain metallic state of Al. Such an underlayer 103 is formed by applying, e.g., a sputtering process. To be more specific, in the sputtering process, for example, reactive sputtering process with mixture of Argon and nitrogen gas is used.

The underlayer 103 contains Ti as the element other than Al and N, but it is not limited thereto. That is, the other element may be Hf, Zr, V, Nb, Ta, Cr, Mo or W may be applied, or a compound containing at least one of Ti, Zr, Hf, V, Nb, Ta, Cr, Mo and W.

Next, as shown in FIG. 3, on the underlayer 103, the first magnetic layer 104 is formed. The first magnetic layer 104 is formed by, for example, sputtering process. At this time, crystallinity of the magnetic layer 104 is controlled by the underlayer 103.

Next, as shown in FIG. 4, on the first magnetic layer 104, the tunnel barrier layer 105 as a tunnel barrier layer is formed. In the present embodiment, the tunnel barrier layer 105 is an MgO layer. The tunnel barrier layer 105 is formed by, for example, sputtering process.

Here, Al contained in the underlayer 103 forms a nitrogenous compound, and the underlayer 103 does not contain the metallic state of Al, and can thus suppress diffusion of Al from the underlayer 103 into the tunnel barrier 105 through the first magnetic layer 104.

If Al exists in the first magnetic layer 104, its magnetic characteristic varies. Also, since Al is metal, if the metallic state of Al exists in the tunnel barrier layer 105, a path (leak path) containing Al may be generated in the tunnel barrier layer 105. Since the tunnel barrier layer 105 is used as the tunnel barrier layer, the leak path causes deterioration of characteristics such as an insulating characteristic of the tunnel barrier layer.

Furthermore, a plurality of MTJ elements exist in an MRAM, and a plurality of tunnel barrier layers in the MRAM. In general, all the plurality of tunnel barrier layers are not deteriorated to the same extent by the leak path. Thus, the characteristics of the plurality of MTJ elements vary. This causes lowering of the function of the MRAM.

However, the underlayer 103 of the present embodiment does not contain the metallic state of Al, deterioration of the magnetic characteristic of the first magnetic layer 104, deterioration of the characteristics of the tunnel barrier layer 105 due to the leak path, and variance in characteristics between a plurality of MTJ elements are restricted.

Next, as shown in FIG. 5, on the tunnel barrier layer 105, the second magnetic layer 106 is formed. The second magnetic layer 106 is formed by, for example, sputtering process. There is a case where the second magnetic layer 106 as the reference layer includes an interface layer which contacts the tunnel barrier layer 10. The interface layer includes, e.g., a CoFeB layer or a CoFe layer.

Figure 6:
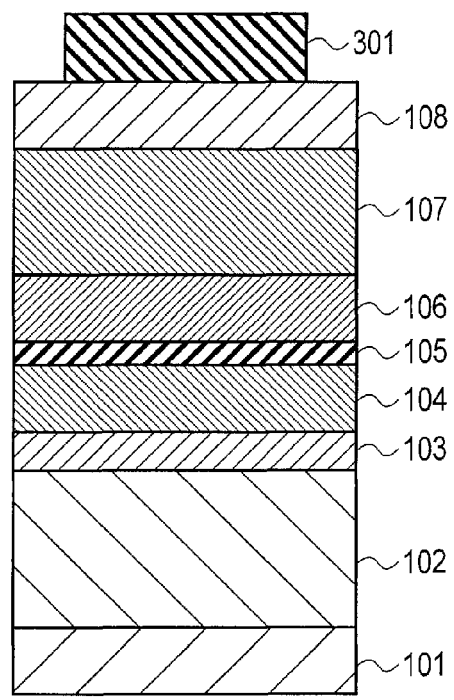
FIG. 6 is a cross-sectional view for explaining the magnetoresistive element according to the first embodiment following FIG. 5.

Next, as shown in FIG. 6, on the second magnetic layer 106, the shift canceling layer 107 is formed. The shift canceling layer 107 is formed by, for example, sputtering process, similar to the layers 104, 105 and 106.

Thereafter, on the shift canceling layer 107, an etching mask 301 is formed, and the each layers 108, 107, 106, 105, 103, 102 and 101 are processed into a predetermined shape by etching with the etching mask 301 used as a mask, and subsequently the etching mask 301 is removed, thereby obtaining the MTJ element shown in FIG. 1.

The above etching is performed by using, e.g., ion beam etching (IBE), reactive ion etching (RIE) or both IBE and RIE.

Figure 7:
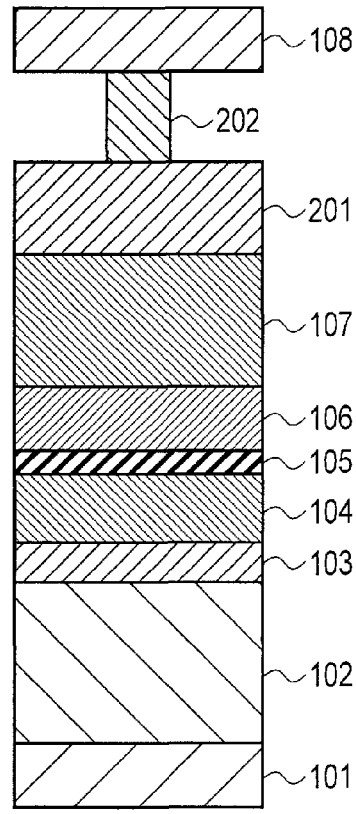
FIG. 7 is a cross-sectional view for explaining a modification of the magnetoresistive element according to the first embodiment.

FIG. 7 is a cross-sectional view for explaining a modification of the magnetoresistive element of the present embodiment. In this modification, the each layers 107, 106, 105, 103, 102 and 101 are processed into a predetermined shape, using a conductive hard mask 201 formed on the shift canceling layer 107. The hard mask 201 is connected to the upper electrode 108 by way of a via plug 202. It is noted that in FIG. 7, an interlayer insulating film is omitted.

For comparison, a sample including a Hf layer and an AlN layer (thickness: approximately 2 nm) formed thereon is prepared. That is, unlike the present embodiment, the AlN layer formed on the Hf layer does not contain Ti. From an analysis result obtained by analyzing this sample by X-ray photoelectron spectroscopy (XPS), it is found that there exists Al not bonding to N in the AlN layer.

One of the reasons for the detection of Al not bonding to N in the AlN layer is considered as follows.

As Hf easily forms a solid solution with Hf compared with Al and HfN is stable, then some of N in AlN layer diffuse into the Hf layer, and stable HfN is generated in the Hf layer, which results in generating Al not bonding to N generates in the AlN layer, thereby it is considered that Al not bonding to N in the AlN layer is detected by analysis of XPS.

Other reason for the detection of Al not bonding to N in the AlN layer is considered as follows.

Figure 8:
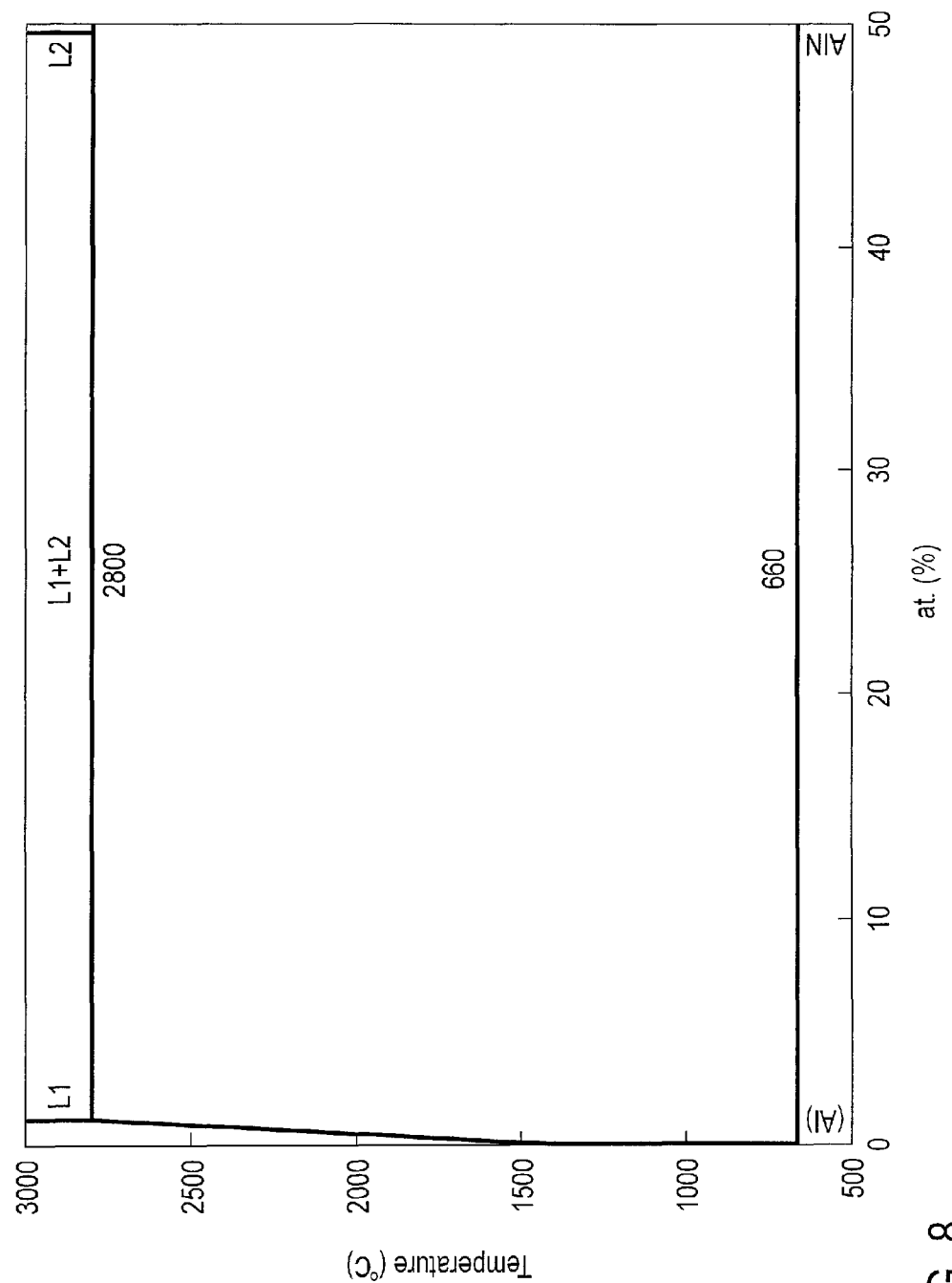
FIG. 8 is a phase diagram of Al—N system.

FIG. 8 is a phase diagram of Al—N system. According to FIG. 8, solid AlN (stoichiometric compound) is obtained when the percentage (atom %) of Al is 50 at. %. That is, in a case of the Al—N system, only one stoichiometric compound exists for the compound of Al and N. When the percentage is a value other than the above value, it is expected that the metallic state of Al and the AlN will be obtained.

Therefore, the AlN layer contains the metallic state of Al, in addition to stoichiometry of AlN, so that it is considered that Al not bonding to N in the AlN layer is detected by XPS.

Figure 9:
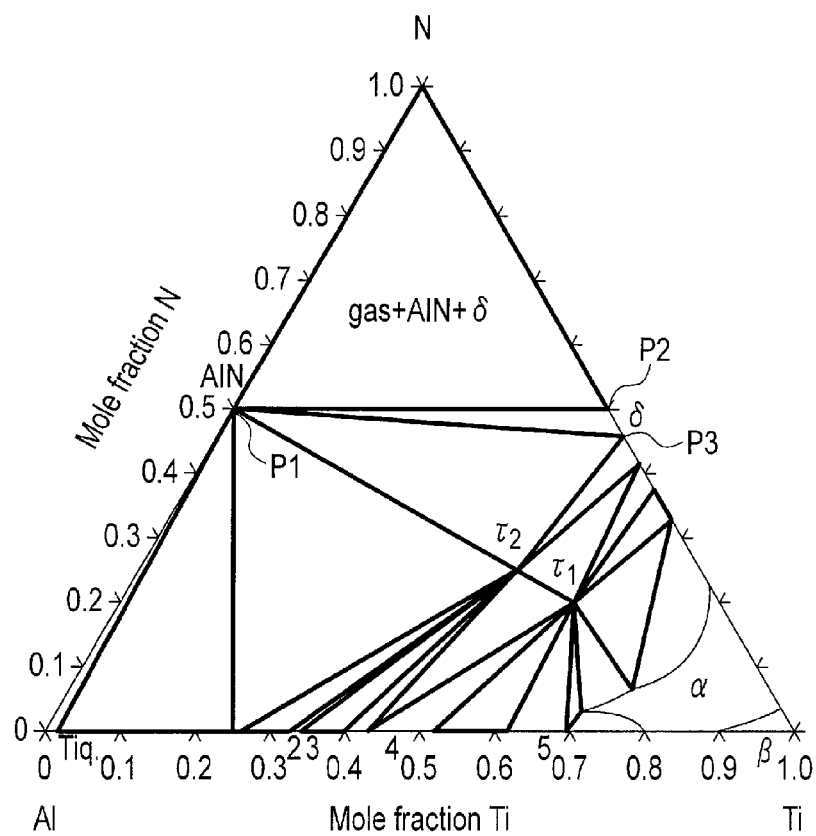
FIG. 9 is a phase diagram of Al—Ti—N system.

FIG. 9 is a phase diagram of Al—Ti—N system. From FIG. 9, in the case of Al—Ti—N system, it can be seen that compounds having Al, Ti and N with various Al composition is obtained. That is, in the case of the Al—Ti—N system, various stoichiometric compounds exist.

Thus, it can be considered that during formation of the MTJ element, even if N in the underlayer 103 (stoichiometric compound: $Al_xTi_yN_z$) formed on the buffer layer 102 diffuses into the buffer layer 102, the underlayer 103 will have a structure including $Al_{x'}Ti_{y'}N_{z'}$ ($z'<z$) containing another stoichiometric compound. As a result, after formation of the MTJ element, the underlayer 103 does not contain the metallic state of Al.

As shown in FIG. 9, in Al—N, only a compound exists, in which Al is 50 at. % and N is 50 at. % (point P1). Thus, if the concentration of N even slightly lowers, the metallic state of Al exists in addition to AlN. On the other hand, in TiN, even if the concentration of N slightly changes, TiN can keep the same crystalline state, and is thus present as TiN (points P2 to P3). That is, referring to FIG. 9, in a region surrounded by P1, P2 and P3, the change of the concentration of N in AlTiN compound in a solid phase can be absorbed by TiN. That is, AlTiN does not easily generate the metallic state of Al, as compared with AlN.

It is noted that although the underlayer 103 can be considered to contain at least one of AlTiN, AlN and TiN, it is preferable from the viewpoint of an underlayer that the underlayer 103 contain AlTiN, and more preferable that the underlayer 103 contain AlTiN only.

Second Embodiment

Figure 10:
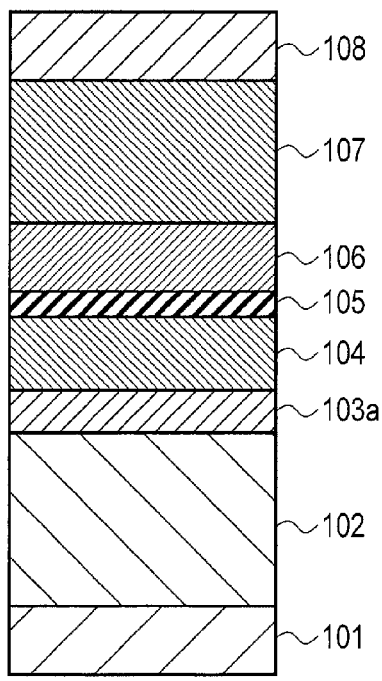
FIG. 10 is a cross-sectional view schematically showing a magnetoresistive element according to a second embodiment.

FIG. 10 is a cross-sectional view schematically showing a magnetoresistive element according to the second embodiment. In the present embodiment, the concentration of Ti (another element) in the underlayer 103a is 10 at. % or more.

Figure 11:
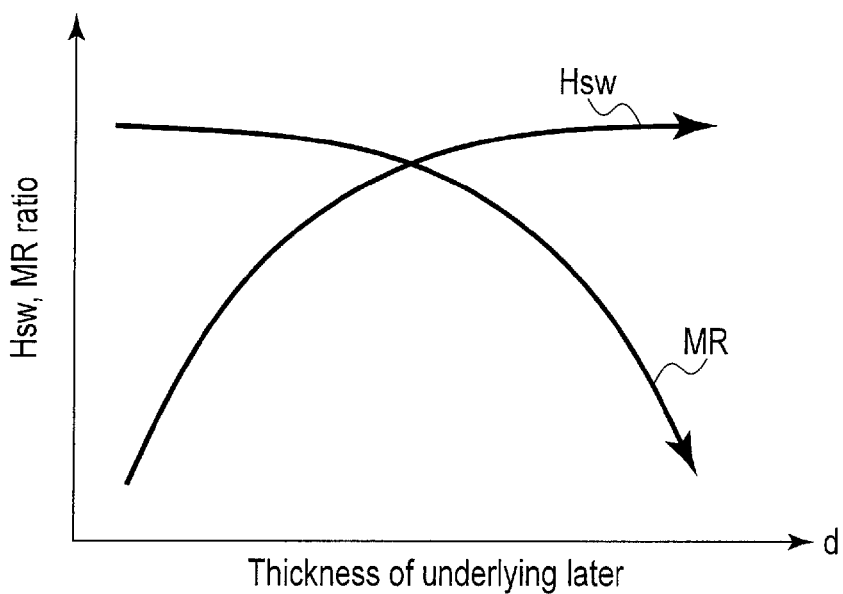
FIG. 11 is a view showing dependence of magnetic switching field and MR ratio on thickness of underlayer.

As shown in FIG. 11, a magnetic switching field Hsw of a storage layer becomes higher as a thickness d of the underlayer increases until the thickness d reaches a given value. However, as shown in FIG. 11, an MR ratio lowers as the thickness d increases. This is because the underlayer is a resistance component not depending on the magnetization direction of the storage layer, and the resistance of the underlayer increases as the thickness d increases.

Thereupon, in the present embodiment, in order to avoid lowering of the MR ratio which accompanies increasing of the thickness d, an underlayer 103 with a concentration of Ti which is equal to or greater than a given value is adopted. The other element is not limited to Ti as in the first embodiment.

Figure 12:
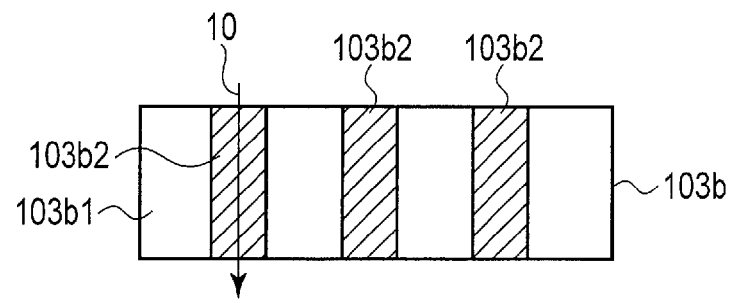
FIG. 12 is a cross-sectional view for explaining a modification of the magnetoresistive element according to the second embodiment.

FIG. 12 is a cross-sectional view of an underlayer 103b for explaining a modification of the present embodiment.

The underlayer 103b includes a first region 103b1 and second regions 103b2. The first region 103b1 contains AlN. The second regions 103b2 contain a compound of Ti and N.

The second regions 103b2 have pillar shapes. Side surfaces of the second region 103b2 are surrounded by the first region 103b1.

The second regions 103b2 have a resistance smaller than that of the first region 103b1. In the figure, 10 denotes an example of a path of current which flows in an underlayer 103c. In order to sufficiently ensure a region (low resistance region) containing the TiN compound having a low resistance in the second region 103b2, it is preferable that the concentration of Ti in the second region 103b2 be equal to or greater than 10 at. %.

The underlayer 103b of the present embodiment comprises the first region 103b1 (AlN) and second regions 103b2 having the resistance lower than that of the first region 103b1, and thus lowering of the MR ratio is restricted, as compared with the case where the underlayer contains AlN only.

Figure 13:
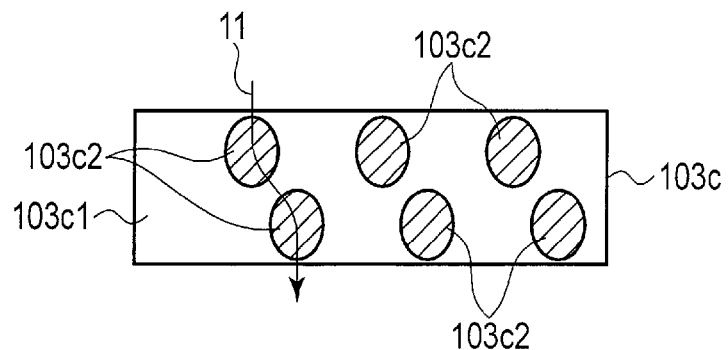
FIG. 13 is a cross-sectional view for explaining another modification of the magnetoresistive element according to the second embodiment.

FIG. 13 is a cross-sectional view of an underlayer 103c for explaining another modification of the present embodiment.

The underlayer 103c includes a first region 103c1 and second regions 103c2. The first region 103c1 contains AlN. The second regions 103c2 contain at least one of a compound of Ti and N and a compound of Al and Ti.

The second regions 103c2, as shown in, e.g., FIG. 13, have ellipsoid shapes. The second regions 103c2 may have shapes other than the ellipsoid shapes. The second regions 103c2 are mostly surrounded by the first region 103c1.

The second regions 103c2 have a resistance smaller than that of the first region 103c1. In the figure, 11 denotes an example of a path of current which flows in the underlayer 103c. In order to sufficiently ensure a region (low resistance region) containing a TiN compound having the low resistance in the second regions 103c2, it is preferable that the concentration of Ti in the second regions 103c2 be equal to or greater than 10 at. %.

In the present embodiment, the underlayer 103c includes the first region 103c1 (AlN) and the second regions 103c2 having the resistance lower than that of the first region 103c1, and thus lowering of the MR ratio is restricted, as compared with the case where the underlayer contains AlN only.

The underlayers 103b and 103c are formed by, e.g., sputtering process and heat treatment. In the sputtering process, for example, a target contains Al and Ti, and sputtering of the target is performed in an atmosphere containing nitrogen. Thereafter the heat treatment is performed on the second regions 103b2 and 103c2. The compounds to be contained in the second regions 103b2 and 103c2 are determined in accordance with the conditions of the above heat treatment and phase diagram.

It is noted that in the present embodiment, the concentration of Ti (another element) in the underlayer 103a is 10 at. % or more; however, it may be smaller than 10 at. % (as long as it is greater than zero).

Each of above described MTJ structures can be introduced as MTJ elements of memory cells. Memory cells, memory cell arrays and memory devices are disclosed in U.S. patent application Ser. No. 13/420,106, Asao, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a magnetoresistive element, comprising:
   forming a crystalline underlayer containing aluminum (Al), nitrogen (N) and X, wherein the X is an element other than Al and N;
   forming a first magnetic layer on the crystalline underlayer;
   forming a nonmagnetic layer on the first magnetic layer;
   forming a second magnetic layer on the nonmagnetic layer; and
   forming a buffer layer, wherein the crystalline underlayer is formed on the buffer layer.

2. The method according to claim 1, wherein the X contains titanium (Ti), zirconium (Zr), hafnium (Hf), vanadium (V), niobium (Nb), tantalum (Ta), chromium (Cr), molybdenum (Mo) or tungsten (W).

3. The method according to claim 1, wherein the forming the crystalline underlayer is carried out in an atmosphere containing nitrogen, and is carried out by using a sputtering process with a target containing Al and the X.

4. The method according to claim 3, wherein the forming the underlayer further comprises subjecting the crystalline underlayer to heat treatment after the sputtering process.

5. The method according to claim 3, wherein the buffer layer contains at least one of Ta, Ti, W, Zr, Hf and Cr.

6. A magnetoresistive element comprising:
   a crystalline underlayer containing aluminum (Al), nitrogen (N) and X, wherein the X is an element other than Al and N;
   a first magnetic layer provided on the crystalline underlayer;
   a nonmagnetic layer provided on the first magnetic layer;
   a second magnetic layer provided on the nonmagnetic layer; and
   a buffer layer, wherein the crystalline underlayer is formed on the buffer layer.

7. The magnetoresistive element according to claim 6, wherein the X contains titanium (Ti), zirconium (Zr), hafnium (Hf), vanadium (V), niobium (Nb), tantalum (Ta), chromium (Cr), molybdenum (Mo) or tungsten (W).

8. The magnetoresistive element according to claim 6, wherein the crystalline underlayer does not contain a metallic state of Al.

9. The magnetoresistive element according to claim 6, wherein the nonmagnetic layer does not contain a metallic state of Al.

10. The magnetoresistive element according to claim 6, wherein the crystalline underlayer further contains a compound of Al and the X.

11. The magnetoresistive element according to claim 6, wherein the crystalline underlayer further contains a compound of N and the X.

12. The magnetoresistive element according to claim 6, wherein the buffer layer contains at least one of Ta, Ti, W, Zr, Hf and Cr.

13. The magnetoresistive element according to claim 6, wherein concentration of the X in the crystalline underlayer is equal to or greater than 10 at. %.

14. The magnetoresistive element according to claim 6, wherein the crystalline underlayer comprises a first region containing a compound of Al and N and second regions containing a compound of the X and N, the first region is different from the second regions in composition, and part of the second regions is surrounded by the first region.

15. The magnetoresistive element according to claim 14, wherein the second regions have pillar shapes.

16. The magnetoresistive element according to claim 15, wherein side surfaces of the second regions are surrounded by the first region.

17. A magnetoresistive element comprising:
   an underlayer comprising $(Al_{50}N_{50})_Z(Ti_Y N_{100-Y})_{100-Z}$, where $50 \leq Y \leq 55$;
   a first magnetic layer provided on the underlayer;
   a nonmagnetic layer provided on the first magnetic layer;
   a second magnetic layer provided on the nonmagnetic layer; and
   a buffer layer, wherein the crystalline underlayer is formed on the buffer layer.

* * * * *